United States Patent [19]

Lutz et al.

[11] Patent Number: 5,246,979

[45] Date of Patent: * Sep. 21, 1993

[54] HEAT STABLE ACRYLAMIDE POLYSILOXANE COMPOSITION

[75] Inventors: Michael A. Lutz, Midland; Kristen A. Scheibert, Sanford, both of Mich.

[73] Assignee: Dow Corning Corporation, Midland, Mich.

[*] Notice: The portion of the term of this patent subsequent to Jul. 30, 2008 has been disclaimed.

[21] Appl. No.: 709,013

[22] Filed: May 31, 1991

[51] Int. Cl.$^5$ .................. C08F 2/50; C08G 77/20; C08G 77/26; C08K 5/10

[52] U.S. Cl. ........................ 522/42; 522/79; 522/99; 522/7; 522/10; 522/33; 522/39; 522/40; 522/43; 522/44; 528/12; 528/14; 528/15; 528/16; 528/18; 528/32

[58] Field of Search ............. 522/79, 99, 42, 7, 10, 522/33, 39, 40, 43, 44; 528/12, 15, 16, 17, 18, 32, 14

[56] References Cited

U.S. PATENT DOCUMENTS

| | | | |
|---|---|---|---|
| 3,884,950 | 5/1975 | Koda et al. | 528/37 |
| 4,322,517 | 3/1982 | Deubzer et al. | 528/32 |
| 4,476,290 | 10/1984 | Hayase et al. | 522/904 |
| 4,608,270 | 8/1986 | Varaprath | 522/99 |
| 4,735,971 | 5/1988 | Innoue et al. | 528/32 |
| 4,824,875 | 4/1989 | Gutek | 522/99 |
| 4,831,064 | 5/1989 | Varaprath | 522/99 |
| 5,036,114 | 7/1991 | Lutz et al. | 522/99 |

OTHER PUBLICATIONS

Copending Application Ser. No. 07/335,639, Filed Apr. 10, 1989.

*Primary Examiner*—Susan Berman
*Attorney, Agent, or Firm*—Roger H. Borrousch

[57] ABSTRACT

The heat stability of acrylamide functional polydiorganosiloxanes which cure by exposure to ultraviolet radiation can be improved by the addition of nickel carboxylate, stannous naphthenate, cerium carboxylate, manganese carboxylate, aluminum carboxylate, silver carboxylate, copper undecylenate, cobalt carboxylate, mono(methacrylate) tripropoxyzirconate, mono(ethylacetoacetonate) aluminum di-(sec-butoxide), di-(ethylacetoacetonate) aluminum sec-butoxide, zinc acetylacetonate, molybdenum acetylacetonate, and dibutyltin dicarboxylate.

15 Claims, No Drawings

HEAT STABLE ACRYLAMIDE POLYSILOXANE COMPOSITION

BACKGROUND OF THE INVENTION

1. Field of the Invention

This invention relates to improving the heat stability of acrylamide functional polydiorganosiloxanes containing compositions.

2. Background Information

Polyorganosiloxanes are known to have valuable properties for protecting surfaces from environmental attack such as from weather, chemical, cold, and heat. However, improvement is still sought, so that, polyorganosiloxane containing materials can be used in harsher environments. Polyorganosiloxanes provide electrical insulating properties which make them useful in the electronics industry for coatings, encapsulants, and potting materials. For example, a printed circuit board may find utility in an engine of an automobile or other vehicle, but the operating temperatures may be too high for prolonged exposure and the polyorganosiloxane containing materials may not adequately maintain their functional properties over prolong use. However, if one can increase the serviceable temperature of the polyorganosiloxane containing material, maybe a coated printed circuit board might be useful for applications where it will be exposed to high temperatures. The polyorganosiloxane containing material should maintain sufficient physical integrity to protect the device it is covering and also it should not release degradation products in amounts which may harm delicate instrumentation.

The use of polyorganosiloxane containing materials which will cure by exposure to ultraviolet radiation provide the advantages that they are fast curing, give off low amounts of volatiles during curing, are readily applicable to automation, cure at low temperatures, and provide reduced energy costs. These are some of the reasons for today's industry wanting to use both polyorganosiloxane containing material and ultraviolet radiation curing. However, many of the polyorganosiloxane compositions which cure by exposure to ultraviolet radiation have relatively low tolerance to prolonged exposure to high temperatures without degrading or loosing their physical properties. To make them more desirable for applications protecting surfaces from harsh environments during and after exposure to high temperatures, the heat or thermal stability needs to be improved. Therefore, a search was conducted to find a means for increasing the serviceable temperature of ultraviolet radiation curable polyorganosiloxane compositions. The means should overcome the effects of exposure to high temperature, such as loss of mechanical strength and toughness, embrittlement and cracking, and reduction in electrical properties.

In our copending application Ser. No. 07/335,639, filed Apr. 10, 1989, now U.S. Pat. No. 5,036,114, the heat stability at 150° C. of acrylamide functional polydiorganosiloxanes can be improved by the addition as heat stability additives zinc naphthenate, stannous octoate, and organotitanates.

SUMMARY OF THE INVENTION

This invention relates to acrylamide functional polydiorganosiloxane curable by exposure to ultraviolet radiation and having improved thermal stability.

This invention relates to a composition comprising a polydiorganosiloxane having on the average more than about 0.4 acrylamide functional groups per molecule and being crosslinkable by exposure to ultraviolet radiation in the presence of a photosensitization system, an effective amount of a heat stability additive selected from the group consisting of nickel carboxylate; stannous naphthenate; cerium carboxylate; manganese carboxylate; aluminum carboxylate; silver carboxylate; copper undecylenate; cobalt carboxylate; mono(methacrylate) tripropoxyzirconate; mono(ethylacetoacetonate) aluminum di-(sec-butoxide); di-(ethylacetoacetonate) aluminum sec-butoxide; zinc acetylacetonate; molybdenum acetylacetonate; and dibutyltin dicarboxylate, and an effective amount of a photosensitization system.

DETAILED DESCRIPTION OF THE PREFERRED EMBODIMENTS

Polyorganosiloxanes which contain the acrylamide functionality useful in the compositions of this invention can be those which are known in the art. They are the linear polydiorganosiloxanes which are essentially composed of diorganosiloxane units but may contain small amounts of other siloxane units can be monoorganosilsequioxane, triorganosiloxy, and $SiO_2$. The acrylamide functionality can be on any of the organic group-containing siloxane units.

The heat stability additives useful for the acrylamide functional polyorganosiloxanes containing compositions of this invention are nickel carboxylate such as nickel naphthenate and nickel octoate; stannous naphthenate; cerium carboxylate such as cerium naphthenate; manganese carboxylate such as manganese naphthenate; aluminum carboxylate such as aluminum octoate; mono(ethylacetoacetonate) aluminum di-(sec-butoxide); di(ethylacetoacetonate) aluminum (sec-butoxide); silver carboxylate such as silver octoate; copper undecylenate; cobalt carboxylate such as cobalt octoate; monomethacrylate tripropoxyzirconate, zinc acetylacetonate; molybdenum acetylacetonate; and dibutyltin dicarboxylate such as dibutyltin dilaurate. These heat stability additives are used in amounts which provide effective property stabilization during exposure to high temperatures over prolonged periods of time. One property which reflects the stability of a cured material during exposure to high temperatures is the hardness expressed as durometer values. A material which significantly increases or decreases in hardness over the heating period reflects product instability. Because degradation can cause the number of crosslinks per unit to increase which increases the hardness, one illustration of heat stability would be that the hardness does not substantially increase during the heating period, such as an increase of less than 100% at 175° C. Because degradation can cause the number of crosslinks per unit to decrease which decreases the hardness, another illustration of heat stability would be that the hardness does not substantially decrease over the heating period, such as a decrease of less than 100% at 175° C. Preferably, the effective amount of heat stability additive is the amount which provides the cured acrylamide functional polyorganosiloxane composition to maintain its durometer value within plus or minus 100% of the initial cured durometer, more preferably, within plus or minus 50% of the initial cured durometer during heating at 175° C. for periods of up to 42 days. The preferred effective amounts are such that the weight percentages of the heat stability additive are within the range of from 0.005 to 5 weight percent based on the weight of composition. Preferred heat stability additives are nickel naphthenate, copper undecylenate, cobalt octoate, stannous naphthenate, nickel octoate, dibutyltin dilaurate, aluminum octoate, and molybdenum acetylacetonate. A number of compounds were evaluated as heat stability additives but were found to be substantially ineffective or were detrimental to the heat stability of the acrylamide functional polyorganosiloxane compositions of this invention. These ineffective compounds were lead naphthenate, copper naphthenate, ferric octoate, and lead octoate.

The heat stability additive is physically blended with the other ingredients to form homogeneous mixtures. The heat stability additive is most effective when it is well dispersed throughout the composition. In some circumstances, the dispersion of the heat stability additive can be assisted by mild heating during the mixing operations. Solvents might be used to aid in dispersion of the heat stability additive.

The acrylamide functionality is bonded to silicon atoms of the polydiorganosiloxane molecules through silicon-carbon bonds and has a formula

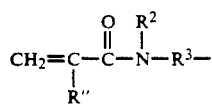

Formula I or the formula

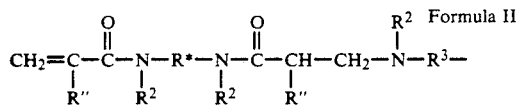

Formula II in which R" is hydrogen atom or methyl, and $R^2$ is hydrogen atom or an alkyl of 1 to 4 carbon atoms, such as methyl, ethyl, propyl, isopropyl, butyl, isobutyl, tertiary butyl. $R^3$ is a divalent hydrocarbon radical having 1 to 10 carbon atoms per radical such as methylene, ethylene, butylene, hexylene, propylene, decylene, $-C_6H_4-$, $-CH_2CH_2C_6H_4-$,

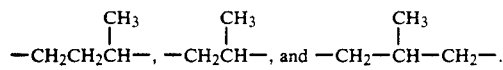

where the preferred $R^3$ are those having 2 to 6 carbon atoms per radical such as ethylene, propylene, isopropylene, butylene, isobutylene, tertiary butylene, pentylene, and hexylene. $R^*$ is a divalent hydrocarbon radical. Examples of $R^*$ as a divalent hydrocarbon radical include methylene, ethylene, propylene, butylene, hexylene, decylene,

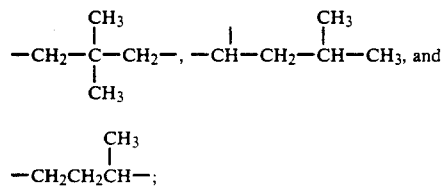

Acrylamide functional polyorganosiloxanes which cure by exposure to ultraviolet radiation are known in the art, for example, Morehouse in U.S. Pat. No. 2,929,829, issued Mar. 22, 1960, teaches that acrylamide compounds can be made by reacting acyl halides with aminoalkyl silicon compounds to produce acylamide functional silicon compounds. Morehouse teaches the following reaction

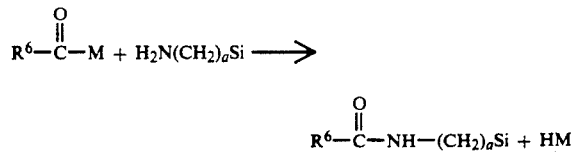

wherein $R^6$ is an alkyl, aryl, alkenyl, or a monovalent heterocyclic ring, M is a halogen atom, and a is an integer of at least 3. When $R^6$ is vinyl, the halogen compound is acryloyl halide and the product formed would be an acrylamide functional silicon compound. Morehouse is hereby incorporated by reference to show a method of preparing acrylamide functional polyorganosiloxanes.

Polyorganosiloxanes having acrylamide functionality are taught by Varaprath in U.S. Pat. No. 4,608,270, issued Aug. 26, 1986, which is hereby incorporated by reference to show the preparation of the polyorganosiloxanes having acrylamide functionality. The polydiorganosiloxanes used in the compositions of this invention have the average unit formula

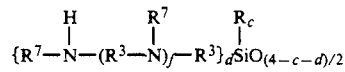

wherein $R^3$ is defined above, R is a monovalent radical such as an alkyl radical, such as methyl, ethyl, propyl, butyl, and cyclohexyl; an aryl radical such as phenyl, 2-phenylethyl, and benzyl; or a fluorinated alkyl radical such as 3,3,3-trifluoropropyl, 2-(perfluoroethyl)ethyl and 2-(perfluorobutyl)ethyl, each $R^7$ is independently $R^2$ or

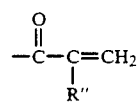

where at least one $R^7$ per molecule is

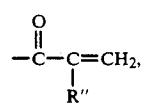

where $R^2$ and R" are defined above, f is 0 or 1, c has a value of from 0 to 2.05, d has a value such that there is at least 0.4 acrylamide functional groups per molecule and up to 0.5 acrylamide groups per silicon atom, preferably d is from 0.001 to 0.04, and c+d has a value of from 1.9 to 2.05. For convenience, Z will be used to represent the acrylamide functional group of the formula

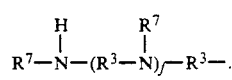

The polydiorganosiloxanes preferably contain siloxane units which are free of acrylamide functional radicals such as $MeSiO_{3/2}$, $Me_2SiO_{2/2}$, $MeViSiO_{2/2}$, $MePhSiO_{2/2}$, $Me_3SiO_{1/2}$, $ViMe_2SiO_{1/2}$ and $SiO_{4/2}$ units, in addition to siloxane units which contain the required acrylamide functional substituted hydrocarbon radicals. Symbols Me, Ph and Vi, as used herein, refer respectively to methyl, phenyl and vinyl. The polydiorganosiloxanes can contain siloxane units with acrylamide functional groups and unreacted amine hydrogen atoms, such as $ZHNCH_2CH_2NHCH_2CH(CH_3)CH_2Si(CH_3)O_{2/2}$.

Preferred polydiorganosiloxanes used in the compositions of this invention have the formula $Z'R_2SiO(R_2SiO)_x(Z'RSiO)_ySiR_2Z'$ wherein each $Z'$ denotes, independently, an R radical or Z as described above and x and y denote numbers having average values of from 10 to 5000 and 0 to 500, respectively. The polydiorganosiloxane has on the average at least 0.4 Z per molecule. Examples of preferred polydi-organosiloxanes include, $ME_3SiO(Me_2SiO)_{500}(MeZ'SiO)_2SiMe_3$, $Z'Me_2SiO(Me_2SiO)_{2000}SiMe_2Z'$, $Z'Me_2SiO(Me_2SiO)_{100}(MeZ'SiO)_3SiMe_2Z'$, $Me_3SiO(MeZ'SiO)_{10}SiMe_3$ and $Z'Me_2SiO(MeZ'SiO)_{10}SiMe_2Z'$.

The polydiorganosiloxanes having acrylamide functionality can be prepared by admixing an acryloyl halide with an amino functional polydiorganosiloxane having on the average at least 0.4 silicon-bonded amino-substituted hydrocarbon radicals containing at least one nitrogen-bonded hydrogen. The mixture is reacted by using an aqueous solution of a water-soluble alkaline material and a water-insoluble solvent for the amino functional polydiorganosiloxane. There should be present at least one acryloyl chloride per one amino hydrogen atom to be converted to acrylamide functionality and at least an equivalent amount of alkaline material relative to the amount of acryloyl chloride. It is to be understood that when acryloyl chloride is referred to, one can substitute methacryloyl chloride.

The amino functional polydiorganosiloxanes can contain on the average at least 0.4 amino functional groups which have at least one amino hydrogen atom for conversion into an acrylamide functional group. The silicon-bonded amino-substituted hydrocarbon radical has the formula which is referred to hereinafter, for convenience, as $Z''$ $$-R^3(N-R^3-)_f-NHR^2$$
$$\phantom{-R^3(N}|\phantom{R^3-)_f-NHR^2}$$
$$\phantom{-R^3(N}R^2$$

wherein $R^2$ and $R^3$, and f are defined above. Examples of amino-substituted hydrocarbon radicals (amino functional) include, $H_2NCH_2CH_2CH_2-$, $CH_3NCH_2CH_2CH_2-$, $H_2NCH_2CH(CH_3)CH_2-$, $H_2NCH_2CH_2NHCH_2CH_2CH_2-$, $H_2NCH_2CH_2NHCH_2CH(CH_3)CH_2-$, $H_2N(CH_2)_6NH(CH_2)_3-$, $H_2N(CH_2)_6NHCH_2CH(CH_3)CH_2-$ $H_2N(CH_2)_2N(CH_3)CH_2CH_2CH_2-$, and $CH_3NHCH_2CH(CH_3)CH_2-$.

The amino functional polydiorganosiloxane can be siloxanes having the average unit formula $$\{R^2N-(R^3-N)_fR^3\}_cSiO_{(4-c-d)/2}$$
$$\phantom{\{}|\phantom{^2N-(R^3}|\phantom{-N)_fR^3\}_c}|$$
$$\phantom{\{}H\phantom{^2N-(}R^2\phantom{-N)_fR^3\}}R_c$$

wherein $R^2$, $R^3$, c, f, and d are defined above. The polydiorganosiloxanes can contain siloxane unit which are free of amino-substituted hydrocarbon radicals, such as, $MeSiO_{3/2}$, $Me_2SiO_{2/2}$, $Me_3SiO_{1/2}$, $MeViSiO_{2/2}$, $MePhSiO_{2/2}$, $ViMe_2SiO_{1/2}$ and $SiO_{4/2}$ units, in addition to siloxane unit which contain the required amino-substituted hydrocarbon radicals.

Preferred amino functional polydiorganosiloxanes to be converted into acrylamide functionality have the formula $Z^2R_2SiO(R_2SiO)_x(Z^2RSiO)_ySiR_2Z^2$ wherein each $Z^2$ denotes, independently, an R radical or a $Z''$ radical and x and y denote numbers having average values of from 10 to 5000 and 0 to 500, respectively. The amino functional polydiorganosiloxane have on the average at least 0.4 $Z''$ per molecule. Examples of preferred amino functional polydiorganosiloxanes to be converted into acrylamide functionality include $Me_3SiO(Me_2SiO)_{500}(MeZ^2SiO)_2SiMe_3$, $Z^2Me_2SiO(Me_2SiO)_{2000}SiMe_2Z^2$, $Z^2Me_2SiO(Me_2SiO)_{100}(MeZ^2SiO)_3SiMe_2Z^2$, $Me_3SiO(MeZ^2SiO)_{10}SiMe_3$, and
$Z^2Me_2SiO(MeZ^2SiO)_{10}SiMe_2Z^2$.

Amino functional polyorganosiloxanes are well known in the organosilicon art and need no detailed description as to their preparation. Some are commercially available. The disclosures of Sommer in U.S. Pat. No. 2,557,803, issued Jun. 19, 1951; Speier in U.S. Pat. No. 2,738,357, issued Mar. 3, 1956; Elliott in U.S. Pat. No. 2,754,312, issued Jul. 10, 1956; Speier in U.S. Pat. No. 2,762,823, issued Sep. 11, 1956; U.S. Pat. No. 2,998,406; U.S. Pat. No. 3,045,036; Morehouse in U.S. Pat. No. 3,087,909, issued Apr. 30, 1963; Brown in U.S. Pat. No. 3,355,424, issued Nov. 28, 1967; Plueddemann in U.S. Pat. No. 3,560,543, issued Feb. 2, 1971; U.S. No. 3,890,269; U.S. Pat. No. 4,036,868; Seiler et al in U.S. Pat. No. 4,152,346, issued May 1, 1979; and Tangney et al in U.S. Pat. No. 4,507,455, issued Mar. 26, 1985 are incorporated herein by reference to further teach how to prepare amino functional polyorganosiloxanes.

The acrylamide functional polydiorganosiloxane for use in the compositions of this invention can be made by admixing the acryloyl halide with the amino functional polydiorgano-siloxane in the presence of an aqueous solution of an alkaline material. The alkaline material can be any water-soluble material having a $pK_b$ value greater than the $pK_b$ of the amine radicals in the amino-substituted hydrocarbon radicals to be converted into the acrylamide functionality. The alkaline material is preferably an alkali metal hydroxide such as sodium hydroxide or potassium hydroxide.

In addition to the aqueous solution of alkaline material, there is also present a water-insoluble solvent for the amino functional polydiorganosiloxane when the acryloyl halide is admixed with the amino functional polydiorganosiloxane. Said solvent can be any suitable liquid that will not react with the components of the reaction. Preferably, the solvent is also a solvent for the acrylamide functional polydiorganosiloxane product of the reaction as well.

Examples of suitable solvents include hydrocarbons such as toluene, xylene, hexane, cyclohexane and heptane; halogenated hydrocarbons such as methylene chloride, chloroform, trichloroethylene and trichloroethane; and oxygenated compounds such as ethyl ether and ethyl acetate. Mixtures of two or more solvents can also be used, it only being required in this instance that the mixture, and not necessarily all the components in the mixture, be a solvent for the amino functional polydiorganosiloxane.

The acryloyl halide, the amino functional polydiorgano siloxane, the aqueous solution of alkaline material, and solvent, can be mixed in any manner, as long as the acryloyl halide is added to the amino functional polydiorganosiloxane in the presence of the alkaline material and the solvent. Preferably the acryloyl halide, or a solution thereof, is added to a well agitated mixture of aqueous alkaline material and solvent solution of amino functional polydiorganosiloxane. The reaction should be carried out at a temperature of from about 0° C. to 10° C. to minimize the production of undesirable by-products and to increase the conversion.

The amounts of the components to be used in this method are not narrowly critical, it only being necessary to have present a sufficient amount of alkaline material to neutralize all hydrogen halide as it is produced when the acryloyl halide reacts with the nitrogen-bonded hydrogen atoms and a sufficient amount of acryloyl halide to convert the amount of amino functionality to acrylamide functionality as desired.

The alkaline material and the acryloyl halide are preferably used in equivalent amounts; e.g. one molecule of sodium hydroxide for every molecule of acryloyl chloride, although an excess of the alkaline material relative to the amount of hydrogen halide produced has not been found to be detrimental to the desired result of the reaction. A deficiency of alkaline material relative to the amount of hydrogen halide produced is to be avoided.

The amount of water that is used in this method should be sufficient to dissolve the alkaline material and, preferably, provide a less-than-saturated solution thereof. A 2% solution of sodium hydroxide has been found to be desirable.

The amount of solvent that is used in this method should be sufficient to dissolve the amino functional polydiorganosiloxane and, preferably, the acrylamide functional polydiorganosiloxane product as well.

During and after the addition of the acryloyl halide to the amino functional polydiorganosiloxane, the reaction mixture should be thoroughly agitated to maintain an intimate contact between the aqueous and nonaqueous phases. Low shear means such as stirrers, paddles and impellers are sufficient to maintain the agitation until the acrylation reaction is finished, typically within an hour. After the reaction is finished, the organic phase is separated from the aqueous phase and the product of the reaction (in the organic phase) is separated from the solvent. It may be desirable to add a polymerization inhibitor to the solution prior to any separating action, such as distilling or fractionating, to avoid undesirable polymerization of the acrylamide groups.

In particular, curable compositions of this invention which are useful for coating can be made from, a fully acrylylated polydiorganosiloxane having the formula $$ZR_2SiO(R_2SiO)_z(ZRSiO)_gSiR_2Z$$

wherein Z and R have the meanings noted above, z has a value of from 10 to 2000 and g has a value of from 0 to 0.1 z. Preferably, the acrylamide functional polydiorganosiloxane having the above formula has a viscosity of from 100 to 10,000 centipoise when the curable composition is to be used as a solventless coating composition.

Examples of acrylamide functional polydiorganosiloxanes having the above formula include $$ZMe_2SiO(Me_2SiO)_zSiMe_2Z,$$

$$Me_3SiO(Me_2SiO)_x(ZMeSiO)_hSiMe_3$$

and $$ZMe_2SiO(Me_2SiO)_x(ZMeSiO)_hSiMe_2Z,$$

wherein h has a value of from greater than 0 to 0.1z and z has the value noted above. In these polydiorganosiloxanes, h has a value such that the polydiorganosiloxane contains on the average at least 0.4 acrylamide functional groups per molecule. Compositions prepared from acrylamide functional polydiorgano-siloxane which have on the average one, two, or more are very useful for making ultraviolet radiation curable coating materials.

A copending application, Ser. No. 07/335,908, filed Apr. 10, 1989, and assigned to the same assignee, in the name of Michael A. Lutz is hereby incorporated by reference to show acrylamide functional polydiorganosiloxane compositions which cure to gels by exposure to ultraviolet radiation and are useful for coating, encapsulating, and potting electronic devices which have fragile components. These compositions are preferred and exhibit significant improvement in thermal stability with the presence of nickel naphthenate, stannous naphthenate, cerium naphthenate, manganese naphthenate, aluminum octoate, silver octoate, nickel octoate, copper undecylenate, cobalt octoate, n-propanol organic zirconate complex, organic aluminum complex, zinc acetylacetonate, molybdenum acetylacetonate, and dibutyltin dilaurate.

These compositions having gel-like properties are unique in that their hardness can have a predetermined durometer at a predetermined viscosity, i.e. the viscosity of the uncured composition and the hardness of the cured composition can be independently controlled. These compositions comprise a blend of acrylamide functional polydiorganosiloxanes and a photosensitization system for curing the blend when irradiated with ultraviolet radiation, wherein the blend is (A) 4 to 90 mole percent of an acrylamide functional endblocked polydiorganosiloxane of the general formula $$YR'_2SiO(R_2SiO)_nSiR'_2Y,$$

(B) 9 to 50 mole percent of a mono-acrylamide functional endblocked polydiorganosiloxane of the general formula $$R'_3SiO(R_2SiO)_nSiR'_2Y,$$

and (C) 0 to 65 mole percent of a non-functional polydiorgano-siloxane of the formula $$R'_3SiO(R_2SiO)_nSiR'_3$$

where, in the above formulae, R is a monovalent radical selected from the group consisting of alkyl, aryl, and fluorinated alkyl; each R' is independently selected from the group consisting of R, and hydroxyl, Y is an acrylamide functional radical bonded to silicon atom through silicon-carbon bond where the acrylamide function has Formula I or formula II, and n has a value of from 30 to 3,000, the mole percentages being based on the total blend as 100 mole percent and where the polydiorganosiloxanes of the blend are present in amounts to provide 20 to 95 percent of the endblocking as acrylamide functionality and 5 to 80 percent of the endblocking as non-functional.

The acrylamide functional polydiorganosiloxanes of (A) are those which have two acrylamide functions per molecule, one per terminating or endblocking siloxane unit, and has the general formula

in which Y, R, R', and n are defined above. Each R' is independently selected from hydroxyl, and a radical represented by R. The acrylamide functional polydiorganosiloxanes of (A) can have a degree of polymerization such that the value of n ranges from 30 to 3,000, preferably from 50 to 1,000 in which the preferred diorganosiloxane units are selected from the group consisting of dimethylsiloxane, phenylmethylsiloxane, diphenylsiloxane, and methyl-(3,3,3-trifluoropropyl)siloxane.

Acrylamide functional polydiorganosiloxanes of (A) can be those in which the acrylamide is N-alkyl-N-acrylamide or N-alkyl-N-methacrylamide. The acrylamide polydiorganosiloxane of (A) contains two acrylamide functional groups bonded to silicon atoms through Si-C bonds on the terminal silicon atoms of the polymer chain. The remaining organic groups bonded to the silicon atoms of the polydiorganosiloxane are defined above for R and are preferably methyl, phenyl, or 3,3,3-trifluoropropyl. The acrylamide functional polydiorganosiloxanes are known in the art from Varaprath cited above and is hereby further incorporated by reference to show the polyorganosiloxanes with acrylamide functionality on the chain terminals where the useful polymers are those made from secondary amine functional polydiorganosiloxanes and to show the methods of making such polymers. The siloxane units can include dimethylsiloxane units, diphenylsiloxane units, methylphenylsiloxane units, methyl-3,3,3-trifluoropropylsiloxane units, and siloxane units having an acrylamide functional group of Formula I in which $R^2$ is hydrogen atom or an alkyl radical of one to four carbon atoms such as methyl, ethyl, propyl, or butyl, $R^3$ is a divalent hydrocarbon radical of 2 to 6 carbon atoms, such as ethylene, propylene, isobutylene, and hexylene. When R" is hydrogen, the acrylamide functionality is the acrylyl radical and when R" is methyl, the acrylamide functionality is the methacrylyl radical. Polydiorganosiloxanes endblocked with

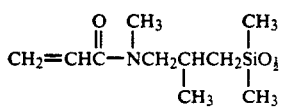

are preferred.

The mono-acrylamide functional endblocked polydiorganosiloxanes of (B) are not particularly well known but can be prepared by many of the methods used to prepare the acrylamide functional polydiorganosiloxanes of (A). The mono-acrylamide functional endblocked polydiorganosiloxanes of (B) can be made by first preparing a polydiorganosiloxane in which some of the endblocking units are triorganosiloxy in which the organic groups are alkyl, aryl, or fluoroalkyl and the remainder of the endblocking units are hydroxyl. Dupree shows such polymers in U.S. Pat. No. 3,274,145, issued Sep. 20, 1966, which is hereby incorporated by reference to show polymers and their preparation.

The mono-acrylamide functional endblocked polydiorganosiloxanes of (B) can also be prepared by several methods by selecting the proper starting materials. It is difficult to prepare the polydiorganosiloxanes of (B) in the pure form, that is, where all the molecules have one non-functional endblock and one acrylamide functional endblock. Most of the economical methods of the preparation of polydiorganosiloxanes involves the use of equilibration methods and these methods produce statistical distributions of molecular species. For example, the preparation of polydiorganosiloxane (B) in which the acrylamide functional endblock uses the method of reacting a silane with hydroxyl endblocked polydiorganosiloxane in the presence of a catalyst can be used if a starting polydiorgano-siloxane is one in which some of the molecules have one hydroxyl endblock and one non-functional endblock such as trimethylsiloxy unit. Such polydiorganosiloxanes are known from Dupree, which is cited above, and is hereby incorporated by reference to show the preparation of polydiorganosiloxane with some of the molecules having one hydroxyl endblock. These hydroxyl end-blocked polydiorganosiloxanes will contain a distribution of molecules such that some of the molecules will have two hydroxyl endblocking groups, some of the molecules will have one hydroxyl endblocking group and one non-functional endblocking group (a triorganosiloxy unit), and some of the molecules will have two non-functional endblocking groups (triorganosiloxy units). The amount of each type of polydiorganosiloxane which is in the polymer mixture will depend upon the ingredients used to prepare it. Polydiorganosiloxanes used for (B) can be controlled best by selecting a method which will provide the desired number of molecules with one hydroxyl endblock. The number of acrylamide functional endblocked polydiorganosiloxane (A) molecules and the number of non-functional polydiorganosiloxanes (C) can then be varied to make a variety of blends. Starting with a polydiorganosiloxane with hydroxyl endblocks such as described by Dupree, one can use the method of reacting an acrylamide functional/alkoxy silane with these polydiorganosiloxanes in the presence of a condensation catalyst such as organotitanates to make the mono-acrylamide functional endblocked polydiorgano-siloxane (B). Similarly, other methods can be used to make various kinds of (B) polydiorganosiloxanes such as those described for making the acrylamide functional endblocked polydiorganosiloxane of (A) except that the starting ingredients include a precursor for providing some non-functional endblocking groups. It is possible to prepare directly a composition having the mole percentage values of (A), (B), and (C) within the limits stated above by using such methods.

The non-functional endblocked polydiorganosiloxanes of (C) are well known in the art and can be obtained commercially. These non-functional polydiorganosiloxanes are also produced by the methods of making polydiorganosiloxanes of (B) which use equilibration techniques.

As stated above, the mole percentages of (A), (B), and (C) are such that (A) is present in amounts to provide 4 to 90 mole percent, (B) is present in amounts to provide 9 to 50 mole percent, and (C) is present in amounts to provide from 0 to 65 mole percent. Those compositions having a blend with zero mole percent (C) are prepared by techniques which use non-equilibration methods for preparing the polydiorganosiloxanes such as the living polymer method in which cyclic trimer of dimethylsiloxane units is polymerized with alkyl lithium. Such methods can produce polydiorganosiloxanes with one hydroxyl endblock and one triorganosiloxy endblock. The blends of this invention are those which are composed of (A), (B), and (C) to provide 20 to 95 percent of the endblocks as acrylamide functionality and 5 to 80 percent of the endblocks as non-functional. The preferred blends contain 45 to 80 percent acrylamide functional endblocks and 22 to 55 percent non-functional endblocks.

The polydiorganosiloxanes of (A) and (B) can be made by a Michael addition method if the appropriate precursors, namely amine endblocked polydiorganosiloxanes, are used where there is an amine on both ends of the polydiorganosiloxane to make (A) and where there is an amine on only one end of the polydiorganosiloxane with the other end being non-functional to make (B). Such polydiorganosiloxanes can be used to make the gel compositions of this invention.

Lee et al in U.S. Pat. No. 4,697,026, issued Sep. 29, 1987, teach acrylamide functional endblocked polydiorganosiloxanes which are made by a Michael addition of diacrylamide or dimethacrylamide functional compounds with primary or secondary amine functional polydiorganosiloxanes. Lee et al is hereby incorporated by reference to show the preparation of polymers which use the Michael addition method.

Acrylamide functional endblocked polydiorganosiloxanes prepared by the Michael addition method are those having at least one acrylamide functional endblocking siloxane unit of the general unit formula Formula III

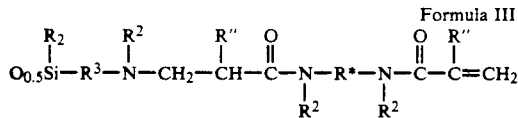

wherein $R^3$, $R^2$, R, R'', and $R^*$ are defined above, and the repeating siloxane units present in the polydiorganosiloxane are these having the general unit formula $R_2SiO$ in which R is defined above.

For polydiorganosiloxane of (A), one type of preferred Michael addition polydiorganosiloxane containing acrylamide functionality endblocking is one in which R is methyl, $R^3$ is

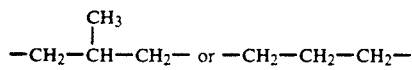

$R^2$ is methyl, R'' is hydrogen atom, $R^*$ is a divalent hydrocarbon radical of the general formula $-(CH_2)_j-$ in which j is an integer of from 1 to 6 and there is an average of 30 to 3,000 dimethylsiloxane units per molecule.

For Michael addition polydiorganosiloxanes of (B), the polymers would be as described above for (A) except that they would have one endblocking triorganosiloxy unit and the other endblocking unit would be the acrylamide functional endblocking siloxane unit of Formula III.

The acrylamide functional endblocked polydiorganosiloxanes of (A) and (B) can be prepared by intimately mixing an amino functional polydiorganosiloxane having endblocking with one primary amine group or secondary amine group per polymer terminal with an acrylamide functional compound having two acrylamide or methacrylamide groups per molecule. When the amine polydiorganosiloxane and acrylamide compound are mixed, there is a reaction which produces acrylamide functional endblocked polydiorganosiloxane and depending upon the amine precursor, whether it has an amine function on both ends or only one end will determine whether it is a polydiorganosiloxane of (A) or (B). This reaction is known as the Michael-type addition reaction. This reaction occurs at room temperature but is rather slow for many commercial applications, for example, the reaction may take as long as 24 hours or more to convert only 40% of the amine to the acrylamide functionality.

Heating the mixture increases the rate of the reaction and at 70° C. as much as 80% of the amine can be converted to the acrylamide functionality. The mixture should not be heated above 100° C. because such temperatures can cause considerable loss of the acrylamide functionality due to a free radical initiated chain reaction. Free radical scavengers, such as p-methoxyphenol, are useful to inhibit the unwanted chain reaction, but these scavengers also inhibit the reactivity of the final acrylamide functional endblocked polydiorganosiloxane during its use, unless they are removed. Although free radical scavengers can be used, their use would add expense to making high purity acrylamide functional endblocked polydiorganosiloxanes.

The best reaction conditions are those in which the intimate mixture is formed using a promoter solvent, such as an alcohol. The preferred alcohols are those which can readily be removed from the reaction product without having to heat it to too high of a temperature. Examples of promoter alcohols are ethanol and isopropanol. The use of the promoter solvent can increase the rate of the reaction such that 90 to 95% of the amine is converted to the acrylamide functionality. The fastest reactions would be those using a promoter solvent and heating the mixture to a temperature above 25° C. and below 100° C.

This method offers the advantage that the acrylamide functional endblocked polydiorganosiloxane can be prepared in the desired structural form before the acrylamide functionality is in place on the molecule. The amine functional endblocked polydiorganosiloxane can withstand the higher temperatures of preparation than if the acrylamide functionality would be present on the precursors used in preparing the polydiorgano-siloxane. For example, the preparation of poly(co-diphenyl-siloxane-co-dimethylsiloxane) requires an alkaline equilibration catalyst with heating to high temperatures, such as 150° C., of a mixture of cyclopolydimethylsiloxane and cyclopolydiphenyl-siloxane. The preparation of a polymer having dimethylsiloxane units, diphenylsiloxane units, and siloxane terminating units having acrylamide functionality could not survive the reaction without causing the acrylamide functionality to polymerize and thus an acrylamide functional polydiorganosiloxane of this type could not be produced. For example, a mixture of cyclopolydi-methylsiloxane, cyclopolydiphenyl-siloxane, alkaline equilibration catalyst, and an amine bearing siloxane precursor could be used to make an amine functional endblocked poly(co-diphenylsiloxane-co-dimethylsiloxane) which could then be converted into an acrylamide functional endblocked polydior-gano-siloxane at a lower temperature. The amine functionality can survive such reactions much more readily than the acrylamide functionality.

The amine functionality can be either primary or secondary. The primary amine functionality reacts much more readily than the secondary amine functionality. For this reason, the di-functional acrylamide compounds readily react with primary amine and the remaining amine hydrogen atom does not readily react with the acrylamide functional group. Such a difference in reaction rates between the primary and secondary amines can be used to advantage in the preparation of acryl functional endblocked polydiorganosiloxanes of either (A) or (B). After one of the acrylamide groups of the di-functional compound reacts with the primary amine, the reaction can be stopped by adding monofunctional acrylamide compounds to react with the remaining secondary amine hydrogens.

The reaction between the amine functional endblocked polydiorganosiloxane and the di-functional acrylamide compound can be stopped by adding a monofunctional acrylamide compound to the reaction mixture. The monofunctional acrylamide compound can be added at two points during the reaction. The amine functional endblocked polydiorganosiloxane and the di-functional acrylamide compound can be mixed, and at the point one wishes the reaction stopped, the mono-functional acrylamide compound is added. One could also add the monofunctional acrylamide compound at the beginning of the reaction, but this uses up amine hydrogen atoms, especially primary amine hydrogen atoms. The monofunctional acrylamide compound is preferably added after the reaction has begun so that the monofunctional acrylamide compounds do not compete with the di-functional acrylamide compounds in such a manner that the number of acrylamide groups on the final silicon compound is not the desired product.

The reaction can also be stopped by another method in which the reaction between the di-functional acrylamide compound and the amine functional endblocked polydiorganosiloxane is stopped by adding an acid anhydride. Using the acid anhydride to stop the reaction has the same benefits as using a monofunctional acrylamide compound with respects to shelf stability, but the use of the acid anhydride has the added advantage that a new compound is formed, namely one in which the acrylamide functional endblocked polydiorganosiloxane has the following group

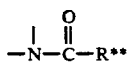

wherein R** is a monovalent hydrocarbon radical or a radical of the general formula —R³—COOH in which R³ is defined above.

The amounts of amine functional endblocked polydiorganosiloxane and the acrylamide functional compound should be such that there is at least one molecule of acrylamide functional compound per two primary amine hydrogens or one secondary amine hydrogen (wherein these primary and secondary hydrogen atoms are before any reaction with the di-functional acrylamine compound begings). The foregoing ratio of acrylamide functional compound to primary amine hydrogen does not mean that the secondary amine hydrogen atoms do not react but only that they react slower and can be readily stopped from reacting by the above mentioned methods.

The amine functional endblocked polydiorganosiloxane can be any of those known in the art which have primary and secondary amine functionality at the chain terminals. These amine functional polydiorganosiloxanes can be prepared by methods well-known in the art as referenced above and many are commercially available.

Amine functional silanes used to make the endblocked polydiorganosiloxanes are exemplified by the following general formula

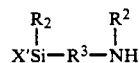

wherein R³, R², and R are defined above. X' is illustrated by an alkoxy radical or an N,N-dialkyl-amino radical. Examples of alkoxy radical are methoxy, ethoxy, propoxy, butoxy, 2-ethylhexoxy, isopropoxy, hexyloxy, 2-methoxyethoxy, 2-ethoxyethoxy. Examples of N,N-dialkylamino radicals are dimethylamino, diethylamino, and diisopropylamino. An example of such a silane is delta-aminobutyldimethylmethoxy-silane. These silanes can be used to endblock the polydiorganosiloxane to provide the amine functional endblocked polydiorganosiloxanes which can be used to make acrylamide functional endblocked polydiorganosiloxanes of (A) or (B).

An example of amine functional endblocked polydiorganosiloxanes for making acrylamide functional endblocked polydiorganosiloxanes of (A) is one of the following formula

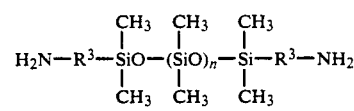

in which R³ is defined above and n has an average value of 30 to 3,000, preferably from 50 to 1,000. An amine functional endblocked polydiorganosiloxane for making acrylamide functional endblocked polydiorganosiloxanes of (B) is one having the following general formula

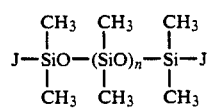

in which n is defined above; one J is methyl and one J is —R³—NH₂ or —R³—NHR², where R² and R³ are defined above.

The di-functional acrylamide compounds used to make the acrylamide functional endblocked polydiorganosiloxane are available commercially or can be made by well-known methods. Examples of the difunctional acrylamide compounds include

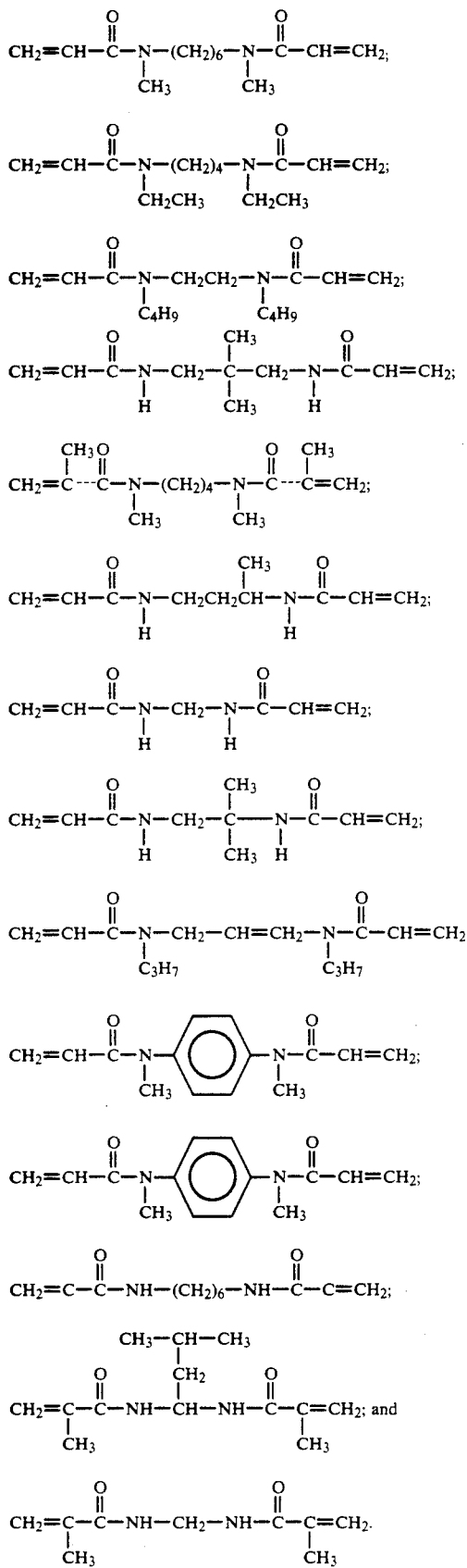

N,N'-dimethylacrylamide can be used to stop the reaction between the di-functional acrylamide compound and the amine functional endblocked polydiorganosiloxane. The anhydrides which can also be used to stop the reaction and are illustrated by acetic anhydride, propionic anhydride, butyric anhydride, isovaleric anhydride, caproic anhydride, palmitic anhydride, stearic anhydride, succinic anhydride, and glutaric anhydride.

Silanes which have the acrylamide functionality can be used to prepare the acrylamide functional endblocked polydiorganosiloxane of either (A) or (B) by reacting the silane with the hydroxyl endblocked polydiorganosiloxane in the presence of a condensation catalyst as described above. Such silanes can be of the following general formula

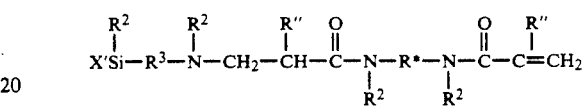

wherein $R^3$, $R^2$, R, X', R", and R* are defined above. Preferably, $R^3$ is an alkylene radical of 3 to 10 carbon atoms, R is methyl, R" is hydrogen, and R* is a divalent hydrocarbon radical.

The gel compositions comprise the heat stability additive, the blend of polydiorganosiloxanes (A), (B), and (C) and a photosensitization system which comprises a photoinitiator useful in curing the acrylamide functional endblocked polydiorganosiloxanes to form a gel with a hardness and modulus suitable for encapsulating and/or coating electronic devices which have fragile components. The compositions are cured by exposure to ultraviolet radiation.

The photosensitization system is in the simplest form, a photoinitiator. It can also include other ingredients which provide some function to the photocurable process, such as the presence of chain transfer agents, like an amine, especially tertiary amines. Other ingredients are known in the art.

The photoinitiator is used in amounts sufficient to provide the desired cure of the gel composition. Examples of photoinitiators include benzoin; benzoin alkyl ethers such as methyl, ethyl, isopropyl, and isobutyl benzion ethers; acetophenone derivatives, such as dialkoxyacetophenone exemplified by diethoxyacetophenone, dichloroacetophenone, trichloroacetophenone, alpha,alpha-dimethoxy-alpha-phenylacetophenone, 1-hydroxycyclohexylphenyl ketone, 2-hydroxy-2-methyl1-phenylpropan-1-one, methylphenyl glyoxylate, 4-benzoylbenzyltrimethylammonium chloride, alpha-acyloxime esters such as 1-phenyl-1,2-propanedione-2-(O-ethoxycarbonyloxime), benzophenone in combination with a chain transfer agent such as an amine and azo-bis(isobutyronitrile), benzil ketals, and ketone amine derivatives. Polysilanes are useful in the compositions which are to be cured by ultraviolet radiation. The polysilane photoinitiators are those which have a chain of catenated silicon atoms in either a linear configuration or in a ring configuration. The polysilanes must be soluble in the blend. The polysilanes can be the phenylmethylpolysilanes defined by West in U.S. Pat. No. 4,260,780, issued Apr. 7, 1981 which is hereby incorporated by reference; the aminated methylpolysilanes defined by Baney et al. in U.S. Pat. No. 4,314,956, issued Feb. 9, 1982, which is hereby incorporated by reference; the methylpolysilanes of Peterson et al. in U.S. Pat. No. 4,276,424, issued Jun. 30, 1981 which is hereby incorporated by reference; and the polysilastyrene defined by West et al. in U.S. Pat. No. 4,324,901, issued Apr. 13, 1982 which is hereby incorporated by reference.

Photoinitiators which are particularly useful in these compositions include

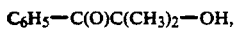

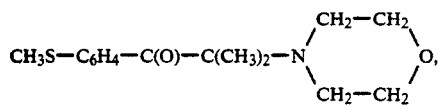

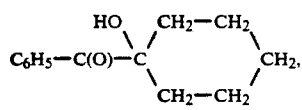

and benzoin methyl ether.

The gel compositions comprising the heat stability additive, the blend, and photoinitiator are reasonably stable during storage but for additional protection and for exceptional situations one may find it advantageous to add a storage stabilizer. The compositions can contain a storage stabilizer including amines, particularly tertiary amines such as diisopropylaminoethanol and trioctylamine. Another type of viscosity stabilizer is the free radical scavenger type, such as p-methoxyphenol (also known as monomethyl ether of hydroquinone), catechol, 4-t-butylcatechol, phenothiazine, hydroquinone, 2,6-di-t-butyl-p-methylphenol, and N-phenyl-2-naphthylamine. The free radical scavenger viscosity stabilizers are used in amounts of preferably zero to one weight percent based on the weight of the composition. If free radical scavenger is used the amounts should be small such as from 0.001 to 0.1 weight percent.

Compositions of this invention can contain optional ingredients which may be suitable for some application, however, those which effect the uncured viscosity, hardness of the cured material, electrical properties, corrosive nature of the composition both uncured and cured should be evaluated when the compositions are to be used as a coating, encapsulant or potting compound for fragile electronic devices. Examples of optional ingredients which might be considered include surfactants, reinforcing agents such as fillers and resins, colorants, and other property modifiers.

The compositions of this invention can be used in many kinds of applications in which curing by ultraviolet radiation is acceptable. Particularly suitable applications are those in which electrical and electronic equipment is to be protected, such as for coating, encapsulating, or potting electronic devices. The compositions of this invention cure to products which vary from hard resin type materials to elastomeric materials to soft gel materials. Some of the compositions are useful for paper coatings. The compositions of this invention provide cured products with improved heat or thermal stability compared to the same compositions without the additives. The additives also appear to maintain the electrical properties after heat aging, even under humid conditions.

The gel compositions of this invention rapidly cure when exposed to ultraviolet radiation, usually in a few seconds, and because they are based on polydiorganosiloxane, they are suitable for integrated circuit protection. These compositions have high ionic purity, low moisture uptake, provide stress relief even at low temperatures, have excellent electrical properties, are thermally stable, and can protect against harsh environments. Because of the nature of the gel compositions to independently vary the viscosity and the hardness, they are useful for photobarrier processing involving "in-situ" generation of flow barriers during material application, and photoimaging to allow wafer stage application of permanent protective coatings. The compositions are shelf stable and can be shipped as a one package container product. The gel compositions can be used to protect integrated circuits and can be used in manufacturing where rapid processing is needed, such as automated production lines.

The following examples are presented for illustrative purposes and should not be construed as limiting this invention which is properly delineated in the claims. In the following examples, "part" or "parts" represents "part by weight" or "parts by weight" and the viscosity is measured at 25° C. unless otherwise stated.

EXAMPLE

1. Preparation of Polymer With The End Groups Being Acrylamide

An amino functional endblocked polydiorganosiloxane was prepared by charging to a reactor 80.98 parts of hydroxyl-dimethylsiloxy endblocked poly(dimethylsiloxane) having an average of 10 dimethylsiloxane units per molecule and slowly adding 19.02 parts of a silane of the formula

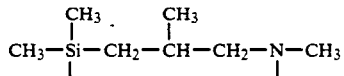

while under a nitrogen blanket and maintaining the temperature below 30° C. After the addition of the silane was completed, the reaction was slowly heated to 80° C. and maintained at that temperature for one hour. Volatiles were then removed at 80° C. and about 45 mm Hg. The resultant amino functional endblocked polydiorganosiloxane, Amino-Polymer A, had an amine neutral equivalent (ANE) of 708.5 g/equivalent.

An amino functional endblocked polydiorganosiloxane, Amino-Polymer B, was prepared by charging to a reactor 3.76 parts of Amino-Polymer A, 12.64 parts of poly(methylphenyl-siloxane) cyclics having from 3 to 6 methylphenylsiloxane units per molecule, 81.92 parts of poly(dimethylsiloxane) cyclics having from 3 to 6 dimethylsiloxane units per molecule, 0.49 part of dimethyl formamide, and 0.01 part of a potassium silanolate catalyst. The resulting mixture was heated at 150° C. for about 8 hours, cooled to 50° C. and then neutralized with 0.044 part of propionic acid. The mixture was stirred for at least one hour, the excess propionic acid was neutralized with 0.049 part of sodium bicarbonate, and then stripped at 150° C. and about 45 mm Hg. To the stripped mixture was added 0.99 part of Supercell, a diatomaceous earth filtering aid, and then the mixture was pressure filtered. The resultant amino functional endblocked polydiorganosiloxane, Amino-Polymer B, had an ANE of 17,870 g/equivalent, a refractive index of 1.4245, a viscosity of 6.75 Pa.s, and a non-volatile content of 97.7%.

An acrylamide functional endblocked polydiorganosiloxane was prepared by adding to a 12-liter, 3-necked flask, 3,000 g Amino-Polymer B, 3,000 g heptane, and 11.79 g sodium methoxide. The mixture was cooled to between 0° C. and 5° C. and 76.3 cc methanol was added and then 17.73 cc of acryloyl chloride in 282 cc heptane was added in 4 hours. After about one hour, 1 cc of propionic acid was added to the reaction mixture followed by 30 g calcium carbonate and 60 g Supercell about one hour later. The resultant solution was pressure filtered through a 0.22 micron membrane filter. The resultant clear solution was mixed with 50 ppm p-methoxyphenol (MEHQ) and 25 ppm phenothiazine and vacuum stripped to 50° C. and less than 10 mm Hg. The resulting product was an acrylamide functional polyorganosiloxane where the amine groups were converted to acrylamide functionality of the formula

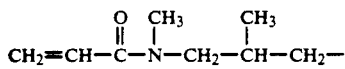

and is designated Acrylamide A which had a 95.2% conversion of amine to acrylamide, a viscosity of 5.71 Pa.s, less than 1 ppm chloride, less than 0.5 ppm sodium, and less than 0.5 ppm potassium.

2. Preparation of Polymer Mixture Having 50% Acrylamide Functional Ends and 50% Non-functional Ends An amino functional polydiorganosiloxane (Amino-Polymer C) was prepared as Amino-Polymer B except a trimethyl-siloxy endblocked polydimethylsiloxane having a viscosity of 2 centistokes was used to replace a portion of the Amino-Polymer A in the reaction mixture such that 50% of the polymer ends were trimethylsiloxy functional and 50% of the polymer ends were amino functional. The resulting product was a transparent fluid with a faint yellow color. The amino functional endblocked polydiorganosiloxane had an average formula

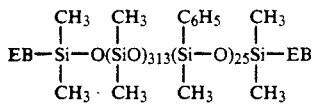

in which EB represents the endblocking in this polymer mixture. The mixture contained according to the calculated values, 25 mole percent of the polymer molecules had two amino functional endblocking groups of the formula

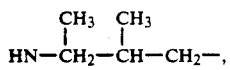

50 mole percent of the polymer molecules had one EB being the amino functional radical as shown above and the other EB group being methyl (non-functional), and 25 mole percent of the polymer molecules had methyl group (non-functional) endblocking. The amino-functional endblocked polydiorganosiloxane was designated Amino-blend A and had 50 percent of the endblocking as amino groups and 50 percent of the endblocking groups as methyl groups. Amino-blend A had a viscosity of 5.65 Pa.s as measured with a HAF #3 spindle at 10 rpm on a Brookfield viscometer, and an ANE (amine neutralization equivalent) of 33,900 g/eq.

An acrylamide functional endblocked polydiorganosiloxane was prepared by adding to a 12-liter, 3-necked flask, 3,000 g of Amino-Polymer C, 3,000 g of hexane, and 7.18 g of sodium methoxide. The mixture was cooled to between 0° C. and 5° C. and 76.3 cc methanol was added and then 11.14 cc acryloyl chloride in 289 cc heptane was added over 4 hours and 25 minutes. After 24 hours, the reaction mixture was pressure filtered through a 0.8 micron membrane filter. The resultant clear solution was stirred about 24 hours with 30 g calcium carbonate and 60 g Supercell filter. The resultant clear solution was mixed with 50 ppm p-methoxyphenol (MEHQ) and 25 ppm phenothiazine and vacuum stripped to 50° C. and less than 10 mm Hg. The product was designated Acrylamide-blend B and had a viscosity of 4.5 Pa.s with an LV #3 spindle at 12 rpm and an ANE of 667,000 g/eq with a conversion of 93.8%. Acrylamide-blend A had an average formula of

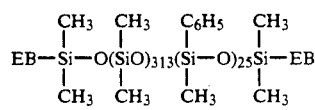

in which EB' represents the endblocking in this polymer mixture. The mixture, as estimated, had 25 mole percent of the polymer molecules with two acrylamide functional endblocking groups of the formula

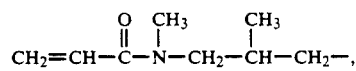

50 mole percent of the polymer molecules with one EB' as the acrylamide functional radical as shown above and the other EB' as methyl (non-functional), and 25 mole percent of the polymer molecules with both endblocking groups as methyl groups (non-functional). This Acrylamide-blend B had an estimated 50 percent of the endblocking as acrylamide groups and 50 percent of the endblocking groups as methyl groups.

3. Preparation of Compositions

Each additive was evaluated for heat stability by making compositions as follows: A mixture of Acrylamide-blend A and Acrylamide-blend B (polymer mixture) were made to give a viscosity of 5.5 Pa.s and a hardness of 30 on the Shore 00 scale. These properties were measured after adding one weight percent (1-hydroxycyclohexyl)phenylmethanone (ketone photoinitiator) to the polymer mixture. The ketone photoinitiator was blended into the polymer mixture by heating at 70° C. for 0.5 hour. Samples of composition were mixed with various additives, as identified in the Table I, in amounts of one weight percent. Each sample was then coated on can lids in thicknesses of 189 mils and were then irradiated with ultraviolet radiation from a Fusion System UV Curing Unit to provide a dosage of 3 J/cm$^2$. Color, compatibility, and tackiness were observed. The initial Shore 00 hardness was measured and then the samples were placed in a forced air oven at 175° C. and the Shore 00 hardness was measured after 1, 3, 7, 14, 21, and 42 days. At 175° C., those compositions which changed by more than 100% in Shore 00 were considered to be undesirable. The results were as reported in Table II.

TABLE I

| COMPOSITION | ADDITIVE COMPOUND | APPEARANCE |
|---|---|---|
| 1. | None | Clear |
| 2. | Nickel Naphthenate | Slightly Hazy |
| 3. | Stannous Naphthenate | Hazy |
| 4. | Cerium Naphthenate | Hazy |
| 5. | Manganese Naphthenate | Hazy, Tan |
| 6.* | Copper Naphthenate | Clear |
| 7.** | Zinc Naphthenate | Clear |
| 8.* | Lead Naphthenate | White, Cloudy |
| 9. | Aluminum Octoate | Hazy |
| 10. | Silver Octoate | Hazy, Brown |
| 11. | Nickel Octoate | Clear |
| 12.* | Copper(II) Octoate | Cloudy, Green |
| 13.* | Ferric Octoate | Clear, Brown |
| 14. | Cobalt Octoate | Clear, Light Brown |
| 15.** | Stannous Octoate | Clear |
| 16.* | Lead Octoate | Cloudy, White |
| 17. | Copper Undecylenate | Hazy |
| 18. | Molybdenum Acetylacetonate | Clear, Green |
| 19. | Zinc Acetylacetonate | Hazy |
| 20.* | Copper Acetylacetonate | Cloudy, Blue-Green |
| 21.* | Tetrabutyltitanate | Clear, Yellow |
| 22. | Dibutyltin Dilaurate | Clear |
| 23. | Mono(methacrylate) Tripropoxyzirconate | Clear, Yellow |
| 24. | Mono(ethylacetoacetonate) Aluminum Di-(sec-butoxide) | Clear |
| 25. | Di-(ethylacetoacetonate) Aluminum Sec-butoxide | Clear, Yellow |

*Comparative Examples
**Additives disclosed in our copending application Serial No. 07/335,639, filed April 10, 1989.

TABLE II

| COMPOSITION | SHORE 00, after | | | | | | | |
|---|---|---|---|---|---|---|---|---|
| | INITIAL | 1 DAY | 3 DAYS | 7 DAYS | 14 DAYS | 21 DAYS | 42 DAYS | CHANGE |
| 1. | 30 | 30 | 23 | 12 | *** | *** | *** | >100% |
| 2. | 36 | 31 | 37 | 30 | 33 | 34 | 39 | −17% |
| 3. | 36 | 34 | 36 | 34 | 33 | 31 | 31 | −14% |
| 4. | 41 | 29 | 28 | 18 | 18 | 18 | 27 | −56% |
| 5. | 42 | 26 | 26 | 16 | 10 | 10 | 18 | −76% |
| 6.* | 15 | 32 | 40 | 48 | 49 | 48 | 54 | +260% |
| 7.** | 40 | 28 | 33 | 38 | 38 | 36 | 42 | −30% |
| 8.* | 41 | 35 | 40 | 49 | 44 | *** | *** | >100% |
| 9. | 40 | 40 | 47 | 50 | 44 | 48 | 48 | +25% |
| 10. | 36 | 29 | 27 | 20 | 28 | 10 | 12 | −72% |
| 11. | 40 | 36 | 42 | 46 | 45 | 47 | 54 | +35% |
| 12.* | 20 | 39 | 44 | 54 | 58 | 60 | 57 | +200% |
| 13. | 9 | 10 | 10 | 24 | 32 | 37 | 25 | +289% |
| 14. | 38 | 26 | 20 | 22 | 22 | 30 | 34 | −28% |
| 15.** | 41 | 40 | 46 | 46 | 41 | 41 | 46 | +12% |
| 16.* | 38 | 34 | 40 | 40 | ** | *** | *** | >100% |
| 17. | 40 | 34 | 37 | 40 | 40 | 42 | 49 | +22% |
| 18. | 36 | 26 | 24 | 20 | 20 | 28 | 35 | −44% |
| 19. | 40 | 36 | 36 | 23 | 10 | 9 | 10 | −78% |
| 20.* | 21 | 32 | 30 | 30 | 38 | 46 | 46 | +119% |
| 21.** | 26 | 30 | 30 | 30 | 39 | 42 | 49 | +88% |
| 22. | 42 | 33 | 34 | 22 | 20 | 21 | 30 | −52% |
| 23. | 34 | 50 | 54 | 58 | 57 | 60 | 68 | +100% |
| 24. | 43 | 45 | 47 | 54 | 52 | 58 | 60 | +40% |
| 25. | 45 | 45 | 53 | 54 | 57 | 60 | 62 | +38% |

*Comparative Examples
*Additives disclosed in our copending application Serial No. 07/335,639, filed April 10, 1989. These additive are not part of the present invention.
***Hardness was not determinable with Shore 00 scale because cured films were too soft to be measured or disintegrated into pieces and therefore could not be measured.

From the results of the above heat stability test, nineteen additives exhibited improved heat stability at 175° C. aging. These additives were nickel naphthenate, stannous naphthenate, cerium naphthenate, manganese naphthenate, aluminum octoate, silver octoate, nickel octoate, cobalt octoate, copper undecylenate, molybdenum acetylacetonate, zinc acetylacetonate dibutyltin dilaurate, mono(methacrylate) tripropoxyzirconate, mono(ethylacetoacetonate) aluminum di-(sec-butoxide), and di-(ethylacetoacetonate) aluminum sec-butoxide, and zinc naphthenate, stannous octoate, and tetrabutyltitanate which are disclosed in our copending application as stated above. The additives exhibiting the most stability over the aging period at 175° C. and at a one weight percent concentration were nickel naphthenate, stannous naphthenate, cobalt octoate, and copper undecylenate. Lead octoate (Composition No. 16) and lead naphthenate (Composition No. 8) were no better than a composition without any additive (Composition No. 1, the control). Although some improvement in the heat stability was observed with copper naphthenate (Composition No. 6), copper(II) octoate (Composition No. 12), ferric octoate (Composition No. 13), and copper acetylacetonate, the percentage change during the aging period at 175° C. was greater than 100% which was determined to be unacceptable. Also, copper naphthenate and ferric octoate had very low initial hardnesses which made them unacceptable.

That which is claimed is:

1. A composition comprising a polydiorganosiloxane having on the average more than about 0.4 acrylamide functional groups per molecule and being crosslinkable by exposure to ultraviolet radiation in the presence of a photosensitization system, an effective amount of a heat stability additive selected from the group consisting of nickel naphthenate, stannous naphthenate, aluminum octoate, copper undecylenate, and cobalt octoate, and an effective amount of a photosensitization system.

2. The composition according to claim 1 in which the polydiorganosiloxane is a blend of (A) 4 to 90 mole percent of an acrylamide functional endblocked polydiorganosiloxane of the general formula

YR′$_2$SiO(R$_2$SiO)$_n$SiR′$_2$Y, (B) 9 to 50 mole percent of a mono-acrylamide functional endblocked polydiorganosiloxane of the general formula $R'_3SiO(R_2SiO)_nSiR'_2Y$, and (C) 0 to 65 mole percent of a non-functional polydiorganosiloxane of the formula $R'_3SiO(R_2SiO)_nSiR'_3$ where, in the above formulae, R is a monovalent radical selected from the group consisting of alkyl, aryl, and fluorinated alkyl; each R' is independently selected from the group consisting of R, and hydroxyl, Y is an acrylamide functional radical bonded to silicon atom through silicon-carbon bond where the acrylamide function has the formula

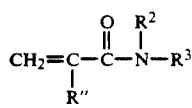

or the formula

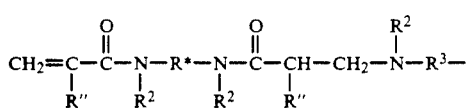

in which R'' is a hydrogen atom or methyl, $R^2$ is hydrogen atom or an alkyl of 1 to 4 carbon atoms, $R^3$ is a divalent hydrocarbon radical having from 1 to 10 carbon atoms per radical, R* is a divalent hydrocarbon radical or a divalent hydrocarbon radical containing ether linkages and n has a value of from 30 to 3,000, the mole percentages being based on the total blend as 100 mole percent and where the polydiorganosiloxanes of the blend are present in amounts to provide 20 to 95 percent of the endblocking as acrylamide functionality and 5 to 80 percent of the endblocking as non-functional a and the heat stability additive is nickel naphthenate.

3. The composition according to claim 2 in which Y is an acrylamido functional group of the formula

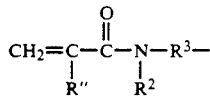

in which $R^3$ is a divalent hydrocarbon radical having from 2 to 6 carbon atoms per radical.

4. The composition according to claim 3 in which the polydiorganosiloxanes of the blend are present in amounts to provide 45 to 80 percent of the endblocking as acryl functionality and 20 to 55 percent of the endblocking as non-acryl functional.

5. The composition according to claim 4 in which the nickel naphthenate is present in an amount of from 0.005 to 5 weight percent based on the weight of the composition.

6. The composition according to claim 2 in which the polydiorganosiloxanes of the blend are present in amounts to provide 45 to 80 percent of the endblocking as acryl functionality and 20 to 55 percent of the endblocking as non-acryl functional.

7. The composition according to claim 1 in which the heat stability additive is stannous naphthenate.

8. The composition according to claim 7 in which the stannous naphthenate is present in an amount of from 0.005 to 5 weight percent based on the weight of the composition.

9. The composition according to claim 1 in which the heat stability additive is cobalt octoate.

10. The composition according to claim 9 in which the cobalt octoate is present in an amount of from 0.005 to 5 weight percent based on the weight of the composition.

11. The composition according to claim 1 in which the heat stability additive is copper undecylenate.

12. The composition according to claim 11 in which the copper undeceylenate is present in an amount of from 0.005 to 5 weight percent based on the weight of the composition.

13. The composition according to claim 1 in which the polydiorganosiloxane is a blend of (A) 4 to 90 mole percent of an acrylamide functional endblocked polydiorganosiloxane of the general formula $YR'_2SiO(R_2SiO)_nSiR'_2Y$, (B) 9 to 50 mole percent of a mono-acrylamide functional endblocked polydiorganosiloxane of the general formula $R'_3SiO(R_2SiO)_nSiR'_2Y$, and (C) 0 to 65 mole percent of a non-functional polydiorganosiloxane of the formula $R'_3SiO(R_2SiO)_nSiR'_3$ where, in the above formulae, R is a monovalent radical selected from the group consisting of alkyl, aryl, and fluorinated alkyl; each R' is independently selected from the group consisting of R, and hydroxyl, Y is an acrylamido functional group bonded to silicon atom through silicon-carbon bond where the acrylamido function has the formula

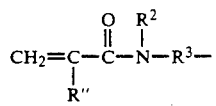

in which R'' is a hydrogen atom or methyl, $R^2$ is hydrogen atom or an alkyl of 1 to 4 carbon atoms, $R^3$ is a divalent hydrocarbon radical having from 2 to 6 carbon atoms per radical, R* is a divalent hydrocarbon radical or a divalent hydrocarbon radical containing ether linkages and n has a value of from 30 to 3,000, the mole percentages being based on the total blend as 100 mole percent and where the polydiorganosiloxanes of the blend are present in amounts to provide 20 to 95 percent of the endblocking as acrylamide functionality and 5 to 80 percent of the endblocking as non-functional and the heat stability additive is aluminum octoate.

14. The composition according to claim 13 in which the aluminum octoate is present in an amount of from 0.005 to 1.5 weight percent based on the weight of the composition.

15. The composition according to claim 1 in which the photosensitization system is (1-hydroxycyclohexyl)-phenyl-methanone.

* * * * *